METHOD AND APPARATUS FOR MOUNTING, CONNECTING AND REPAIRING STACKED CIRCUIT BOARDS

Filed Dec. 21, 1967

INVENTORS R. L. HARRIS, JR.
W. L. HARROD

BY Charles E. Graves

ATTORNEY

United States Patent Office 3,462,540
Patented Aug. 19, 1969

3,462,540

METHOD AND APPARATUS FOR MOUNTING, CONNECTING AND REPAIRING STACKED CIRCUIT BOARDS

Richard L. Harris, Jr., Clarendon Hills, and William L. Harrod, Downers Grove, Ill., assignors to Bell Telephone Laboratories, Incorporated, Murray Hill and Berkeley Heights, N.J., a corporation of New York
Filed Dec. 21, 1967, Ser. No. 692,595
Int. Cl. H05k *1/02*
U.S. Cl. 174—68.5 5 Claims

ABSTRACT OF THE DISCLOSURE

A matrix of wire wrap pins set in epoxy or the like provide a basic mounting module upon which printed circuit boards are mounted in high densities. Connections to each board in turn are made by dropping solder plated washers over each pin. These can be severed where necessary by a hollow end-cutting tool that fits over the pin and cuts down through all boards to a faulty or undesired connection. Any reconnections that can be made by wire wraps to the pin's exposed ends.

Figures 1, 2A, 2B, 2C, 2D:
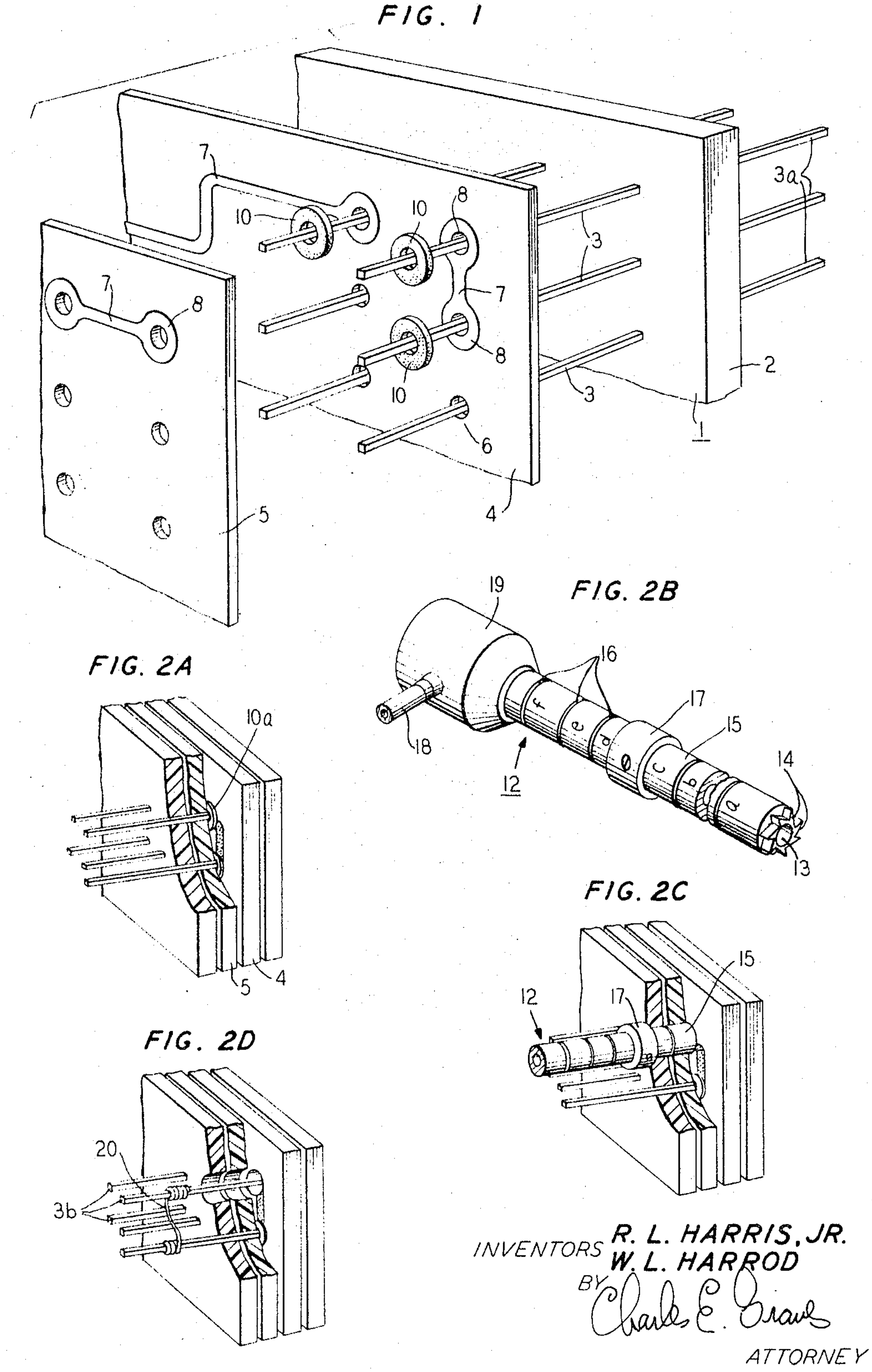

This invention relates to electric circuit interconnection practice, and more specifically to a method and apparatus for mounting, connecting and repairing stacked circuit boards.

It is increasingly common to fabricate electronic packages as components and associated circuit paths mounted on boards in multiple layers, with interconnections between boards to complete the package.

A frequent problem associated with these packages is that the methods now used to connect the different layers or circuit boards do not lend themselves readily to repair and revision of connections. One consequence is that repairs are costly and cumbersome to effect. Equally important, the very high circuit packaging density potential of integrated circuitry is unrealized in many instances The present invention is a simplified method for building up the circuit board stack with the desired interconnections, and also teaches a repair and modification feature.

One object of the invention, accordingly, is to simplify interconnections between layers of printed circuit boards.

Another object of the invention is to reduce the cost of such interconnections.

A further object of the invention is to modify or repair remote connections between circuit boards in a stack without disturbing existing connections.

In accordance with one aspect of the invention, the basic circuit board mounting module is a matrix of parallel pins set in epoxy or the like. The pins serve as through connects, wire wrap points, male connectors and also as guides for a repair tool. In each circuit board to be mounted on the pin matrix, there is a like matrix of over-size holes which fit easily over the pins. Connections between each pin and a given circuit board are made by placing solder-plated washers over the pin and applying heat. Each successive board is so connected until the full stack is built up, leaving, however, a segment of each pin exposed.

Then, pursuant to another facet of the invention repairs are made to a given remote connection point by use of a hollow end-cutting tool that fits over the pin in question, cuts down through all boards to the solder connection to be modified, and severs it from the pin. Reconnection, if needed, or for that matter other primary connection, can be made by wire wraps to the exposed end segments of the appropriate pins.

A feature of the invention, therefore, resides in the use of a mounting matrix of wire wrap pins as support for a large plurality of printed circuit boards with the option that interconnections from pins to board can be made either with solder-plated washers or across the pin ends with wire wraps.

An added feature of the invention resides in the ease of repair or modification to the described structure, effected by severing all internal connections to a given pin and effecting reconnections across the pin ends.

The invention, its further objects, features and advantages will be readily understood from a reading of the description to follow an illustrative embodiment thereof.

In the drawing:

FIG. 1 is an exploded frontal perspective view of an inventive mounting module with several circuit boards mounted; and FIGS. 2A through 2D are schematic diagrams showing the sequence of procedure, and the tool, for making wiring changes to the assembled stack.

FIG. 1 shows the basic mounting structure designated 1, as made up of a block 2 advantageously of castable material such as epoxy. Into block 2 a matrix of pins 3 has been set, each pin extending from one side of block 2 to receive circuit boards and, advantageously, also extending from the posterior side of block 2 to serve as male connectors. Since pins 3 are to provide wire wrappable connection points for wiring additions and changes, the pins must be suitably shaped with edges at the wire-wrap points. Pins 3 comprise as well the through-connects between one circuit board and another, such as boards 4, 5.

Each circuit board 4, 5 has a matrix of holes 6 which match the pattern of pins 3. Holes 6 are intentionally made oversized to enable each board 4, 5, to be mounted readily over the pins. Printed wiring paths 7 on each board include the usual land areas 8 surrounding the holes where connections will be made. In the present invention, land areas 8 surround but do not overlap into the holes 6.

The circuit boards used are the conventional single sided printed circuit boards. These may consist merely of circuit paths such as needed in the back plane wiring of telephone electronic switching systems; or may include some components mounted on the reverse side thereof (components not shown). In assembly, each board is stacked in turn over the pin matrix; and when in position, solder-plated washers 10 are dropped over each pin to be connected. The solder connection is then made between the pins and the appropriate land areas 8 by heating the washer either with a conventional hollow tool resembling a soldering iron; or by infra-red or other heating techniques.

Successive connection of each printed circuit board follows the same procedure until a complete multilayer interconnection matrix is built up consisting typically, but not necessarily, of from five to twenty boards. The pins rigidly hold the board layers together, leaving a small expansion space between adjacent boards.

Of real advantage in cost and convenience is the use of remote pin ends 3*a* as male connectors. Since the pins 3 are firmly emplanted in block 2, the extension of each pin slightly beyond the rear surface thereof creates a firm built-in plug connection feature without added parts.

Pursuant to a main facet of the invention, the described structure uniquely lends itself to repair of faulty connections between a pin and a given land area as well as to effecting field wiring changes. This feature of the invention is illustrated in FIGS. 2A through 2D. FIG. 2A shows a remote printed wiring connection which requires a repair or revision.

The printed wiring connection, shown as 10*a*, is first removed by cutting, using a tool such as the one depicted in FIG. 2B. This tool designated 12, comprises a hollow interior bore 13 and one or more cutting blades 14 mounted at the cutting end of a shaft 15. The cutting blades are of a size and shape that can rout out a hole of substantially the same diameter as the holes 6 through circuit boards 4, 5. The shaft 15 includes suitable graduations labeled *a*, *b*, *c*, etc., along its shank which denote the board thicknesses and hence the various depths at which the connections occur. An adjustable collar 17 on shaft 15 serves as a guide to fix the depth of cut. A conventional vacuum connection, designated generally as 18, and communicating with bore 13 of the tool removes chips as the tool slices through the board layers. Suitable means such as motor 19 may be provided to rotate the tool 12 cutting end; or the tool may be manually rotatable.

Tool 12 is inserted over the involved pin which positions the hollow bore 13 and thus serves as a guide for the tool as it advances down through the line of holes 6 in the successive boards. As shown in FIG. 2C, the tool cutting blades 14 reach a connected washer 10 and slice through it, severing the land area at that point from the pin. After the connection has been broken and the tool removed, a new connection may be made to the exposed ends 3B of the appropriate pins, using wire wrap technique as illustrated in FIG. 2D. There, a wire wrap 20 is effected to a different pin; or, it might be effected across the same two pins involved in the now-severed connection. In any case, the versatility of the method, the ease of rearrangement or reconnection of remote original connections, and the lack of disturbance to adjacent connections, is readily apparent.

In summary, the described interconnection technique represents an improved method for fabricating multilayer printed circuitry. The method reduces the incidence of loss of entire multilayer packages due to fabrication faults or necessary circuit changes. Further, fabrication of multilayer printed circuitry is less expensive because with the present invention much relaxed tolerances are possible between circuit boards and their interconnecting media.

The use of one set of pin ends as a male connector and the other set as wire-wrap secondary connection points represents a significant conservation of space and materials.

What is claimed is:

1. An interconnected printed circuit assembly comprising: a matrix of mounted pins, a plurality of circuit boards each with a like matrix of oversize holes and placed upon said pins, and solder-coated washer connections between selected pins and the circuit paths of each board, said pins protruding beyond at least one side of the assembled stack for effecting desired wire-wrap connections externally of said stack.

2. A circuit assembly as in claim 1, wherein said pins also extend beyond the other side of said assembled stack as male connectors.

3. A circuit assembly comprising a matrix of parallel conductive pins mounted in an insulative block and extending from at least one side thereof, a plurality of circuit boards mounted on said pins, each board comprising at least printed circuit paths, each board including a matrix of holes substantially larger in diameter than said pins and patterned after said pin matrix for mounting of said boards thereon in a stack that leaves the pin ends exposed, land areas of certain circuit paths surrounding selected ones of said holes, and solder-coated washer connections between these land areas and their associated pins.

4. A circuit assembly as in claim 3, wherein said pins also extend slightly beyond the other side of said block.

5. A circuit assembly as in claim 3, wherein said insulative block is formed of epoxy resin.

References Cited

UNITED STATES PATENTS 3,371,249 2/1968 Prohofsky ______ 174—68.5 XR

DARRELL L. CLAY, Primary Examiner

29—626; 317—101; 339—17